United States Patent [19]
Tanabe

[11] Patent Number: 5,476,736
[45] Date of Patent: Dec. 19, 1995

[54] PROJECTION EXPOSURE METHOD AND SYSTEM USED THEREFOR

[75] Inventor: Hiroyoshi Tanabe, Tokyo, Japan

[73] Assignee: NEC Corporation, Tokyo, Japan

[21] Appl. No.: 201,323

[22] Filed: Feb. 24, 1994

[30] Foreign Application Priority Data

Feb. 25, 1993 [JP] Japan ................................ 5-036914

[51] Int. Cl.⁶ ........................................................ G03F 9/00
[52] U.S. Cl. ........................... 430/22; 430/312; 430/394; 430/397; 355/53; 355/67; 355/68
[58] Field of Search ................................ 430/5, 22, 312, 430/397, 394; 355/53, 67, 68

[56] References Cited

U.S. PATENT DOCUMENTS

| | | | |
|---|---|---|---|
| 5,255,050 | 10/1993 | Kitagawa | 430/397 |
| 5,305,054 | 4/1994 | Suzuki et al. | 355/53 |

FOREIGN PATENT DOCUMENTS

| | | |
|---|---|---|
| 0503472 | 9/1992 | European Pat. Off. |
| 61-91662 | 9/1986 | Japan |
| 63-42122 | 2/1988 | Japan |
| 4-180612 | 6/1992 | Japan |

OTHER PUBLICATIONS

H. Fukuda et al., "A New Method for Enhancing Focus Latitude in Optical Lithography: FLEX", IEEE Electron Device Letters, vol. EDL-8, No. 4, Apr. 1987, pp. 179-180.

N. Shiraishi et al., "New Imaging Technique for 64M-DRAM", SPIE, vol. 1674, Optical/Laser Microlithography V, (1992) pp. 741-752.

*Primary Examiner*—S. Rosasco
*Attorney, Agent, or Firm*—Sughrue, Mion, Zinn, Macpeak & Seas

[57] ABSTRACT

A projection exposure method in which a mask pattern containing both an isolated geometrical shape and closely arranged geometrical shapes can be improved in depth of focus. A central part in cross section of a beam of light is darkened prior to illumination of a mask. The beam of light thus darkened is projected to a photoresist film formed on a substrate through the mask and an optical projection system to carry out a first exposure. Next, at least one of the photoresist film and the optical projection system is relatively moved along an optical axis of the optical projection system, and then, the darkened beam of light is projected again to the photoresist film through the mask and the optical projection system to carry out a second exposure at a different position from that in the first exposure. A surface of the photoresist film is not in accordance with a focal plane of the optical projection system during the first and second exposures, respectively. The pattern of the mask is transferred on the photoresist film through the first and second exposures.

9 Claims, 9 Drawing Sheets

FIRST EXPOSURE

SECOND EXPOSURE

FIRST EXPOSURE

SECOND EXPOSURE

FIRST EXPOSURE

SECOND EXPOSURE

FIRST EXPOSURE

SECOND EXPOSURE

PROJECTION EXPOSURE METHOD AND SYSTEM USED THEREFOR

BACKGROUND OF THE INVENTION

1. Field of the Invention

The present invention relates to a projection exposure method and a system used therefor and more particularly, to a projection exposure method applicable to pattern transfer during a fabrication sequence of semiconductor integrated circuits or the like and a projection exposure system used for the method.

2. Description of the Prior Art

In some fabrication processes of semiconductor integrated circuits (ICs) where fine patterns are required to be formed, a projection exposure system has been widely used because of its high fabrication efficiency.

The resolution and the depth of focus (DOF) of a conventional projection exposure system change dependent on the numerical aperture (NA) and the exposure wavelength of a projection lens system used in the projection exposure system. If the NA is made large and/or the exposure wavelength is made short in order to improve the resolution, there arises a disadvantage that the DOF becomes shallow.

Conventionally, to make the DOF deeper without change or degradation in the resolution, a projection exposure method called as the "Focus Latitude enhancement Exposure (FLEX)" was developed, which is disclosed in the Japanese Non-Examined Patent Publication No. 63-42122. In the FLEX, multiple exposures are carried out in several different positions along the light axis of its optical projection system.

Additionally, to make the DOF deeper, another projection exposure method using a modified illumination was developed, which is disclosed in the Japanese Non-Examined Patent Publication No. 4-180612. In the method, there is provided a modification member for modifying an illumination beam of light in the optical path of the illumination beam.

With the conventional method named FLEX, a DOF can be increased for an isolated geometric shape of a mask pattern because of the large distances between the isolated geometric shape and the other adjacent geometric shapes thereof. However, for closely arranged geometric shapes of the mask pattern, the contrast of optical images of the closely arranged shapes becomes lower because of the small distances among the adjacent geometric shapes, so that the adjacent two ones of the geometric shapes cannot be resolved. Thus, it has been considered that the conventional method named FLEX is effective for only the isolated geometric shapes, so that the application field of the FLEX has been restricted to a projection exposure process for forming contact holes in several fabrication processes of semiconductor ICs.

With a conventional IC mask including geometric shapes for contact holes, the distances between adjacent contact holes or adjacent geometric shapes have been two times as large as the diameters or sizes of the contact holes, or more. Therefore, conventional IC masks contain patterns formed substantially of a plurality of isolated geometric shapes.

Recently, however, to increase the integration degree of semiconductor ICs, a mask whose pattern contains both isolated geometric shapes and closely arranged geometric shapes required to be used.

For example, as shown in FIG. 1, a semiconductor IC mask 34 has an isolated square shape 43 and a plurality of closely arranged square shapes 44. The shapes 43 and 44 are both used for contact holes. The distances or pitches between adjacent closely arranged shapes 44 are less than two times as large as the respective sizes of the shapes 44.

In the case of the mask 34, there arises a problem that the closely arranged square shapes 44 cannot be resolved when the conventional method named as FLEX is used to make the DOF of the isolated square shape 43 deeper.

On the other hand, with the conventional method using the modified illumination, the DOF for the closely arranged shapes 44 can be made deeper, however, the DOF for the isolated shape 43 is not made deeper. This means that the conventional method using the modified illumination cannot make the DOF large for all of the shapes 43 and 44.

FIG. 2 shows another IC mask 54 having a line-and-space pattern. The pattern is formed of an isolated linear shape 45 like a strip and a plurality of closely arranged linear shapes 46 like strips. The shapes 45 and 46 are used for electrical interconnection, respectively. The distances or pitches between the adjacent two closely arranged shapes 46 are less than two times as large as the respective widths of the linear shapes 46.

Also in the case of the mask 54, there arises the same problems as that of the mask 34 shown in FIG. 1.

SUMMARY OF THE INVENTION

Accordingly, an object of the present invention is to provide a projection exposure method in which a mask pattern containing both an isolated geometrical shape and closely arranged geometrical shapes can be improved in depth of focus, and a projection exposure system used for the method.

According to a first aspect of the present invention, a projection exposure method is provided.

In the method, a beam of light whose central part in cross section is darkened is used. The partially darkened beam of light illuminates to a mask having a pattern through an optical illumination system. Then, the beam of light is projected to a photoresist film formed on a support member through the mask and an optical projection system to carry out a first exposure.

Subsequently, at least one of the photoresist film and the optical projection system is moved relative to one another along an optical axis of the optical projection system, and the beam of light is projected again to the photoresist film through the mask and the optical projection system to carry out a second exposure. Thus, the first and second exposures are carried out at different positions from each other.

A surface of the photoresist film is not in accordance with a focal plane of the optical projection system in both the first and second exposures. The pattern of the mask is transferred on the photoresist film through the first and second exposures.

The beam of light may be varied in wavelength. In this method, the beam of light having a first wavelength is projected to the photoresist film through the mask and the optical projection system to carry out the first exposure, and the beam of light having a second wavelength which is different from the first wavelength to the photoresist film through the mask and the optical projection system to carry out a second exposure at the same position as that in the first exposure.

If only one exposure may be carried out, the beam of light is varied continuously in wavelength during the exposure.

There is an advantage that no positional shift or deviation of the pattern occurs because the above relative movement is not required between the first and second exposures.

Varying of the wavelength, the optical path of the beam of light between the mask and the photoresist film may be changed. The first exposure is carried out at a first length of the optical path and the second exposure is carried out at a second length thereof which is different in value to the first length.

Preferably, to produce the difference in the optical path length, there is provided a transparent member between the mask and the photoresist film in one of the first and second exposures. However, first and second transparent members whose optical path length are different from each other may be provided between the mask and the photoresist film in the first and second exposures, respectively.

The optical projection system may have a plurality of different focal points, which is similar to a multifocal lens. In the case, the beam of light is projected to the photoresist film in the first exposure using a first one of the plurality of focal points, and it is projected to the photoresist film in a second exposure using a second one of the plurality of focal points. This results in a difference of the focal lengths between the first and second exposures, which is equivalent to the relative movement of the photoresist film and the optical projection system described above.

With the projection exposure method of the present invention, the beam of light whose central part in cross section is darkened illuminates to the mask, and the beam of light passing through the mask is projected to the photoresist film through the optical projection system to carry out the first and second exposures or the single exposure under the different conditions. Additionally, a surface of the photoresist film is not in accordance with a focal plane of the optical projection system in both the first and second exposures, or the single exposure.

Thus, the depth of focus for an isolated geometrical shape is improved due to such the exposure or exposures as described above and that for closely arranged geometrical shapes is improved due to partial darkening of the beam of light. Therefore, a mask pattern containing both the isolated geometrical shape and the closely arranged geometrical shapes can be improved in depth of focus.

According to a second aspect of the present invention, a projection exposure system is provided, which is used for the projection exposure method of the first aspect.

The projection exposure system includes a light source for generating a beam of light, an optical illumination system for illuminating the beam of light to a mask, a darkening member disposed between the light source and the mask. The darkening member darkens a central part in cross section of the beam of light and the mask is illuminated with the darkened beam of light.

The projection exposure system further contains a stage on which a supporting member with a photoresist film is placed and an optical projection system for projecting the darkened beam of light to the photoresist film.

In the projection exposure system of the present invention, a first exposure is carried out by projecting the darkened beam of light to the photoresist film through the mask and the optical projection system. Then, at least one of the photoresist film and the optical projection system is relatively moved along an optical axis of the optical projection system, and thereafter, a second exposure is carried out by projecting the darkened beam of light to the photoresist film through the mask and the optical projection system at a different position from that in the first exposure.

A surface of the photoresist film is not in accordance with a focal plane of the optical projection system in the first and second exposures, respectively, and the pattern of the mask is transferred on the photoresist film through the first and second exposures.

The beam of light may be able to change in wavelength. In the case, the first exposure is carried out by projecting the darkened beam of light which has a first wavelength, and a second exposure is carried out by projecting the darkened beam of light which has a second wavelength at the same position as that in the first exposure.

Only one exposure may be carried out. In the case, the darkened beam of light is projected to the photoresist film with the beam of light varying continuously in wavelength during the exposure.

There is an advantage that no positional shift or deviation of the pattern occurs because the above relative movement is not required between the first and second exposures.

Preferably, there is provided with means for changing the optical path length of the beam of light between the mask and the photoresist film. In the case, the first exposure is carried out at an optical path of a first length, and a second exposure is carried out at an optical path of a second length which is different from the first length.

Preferably, the optical projection system has a plurality of different focal points. In this case, the first and second exposures can be carried out using a first one and a second one of the plurality of focal points, respectively.

With the projection exposure system of the second aspect, the projection exposure method of the first aspect can be carried out easily.

In the present invention, in the case that the beam of light has a certain width or breadth in wavelength, the term of "wavelength" means a central or main one of the wavelengths of the beam.

DESCRIPTION OF THE PREFERRED EMBODIMENTS

[First Embodiment]

Figure 3:
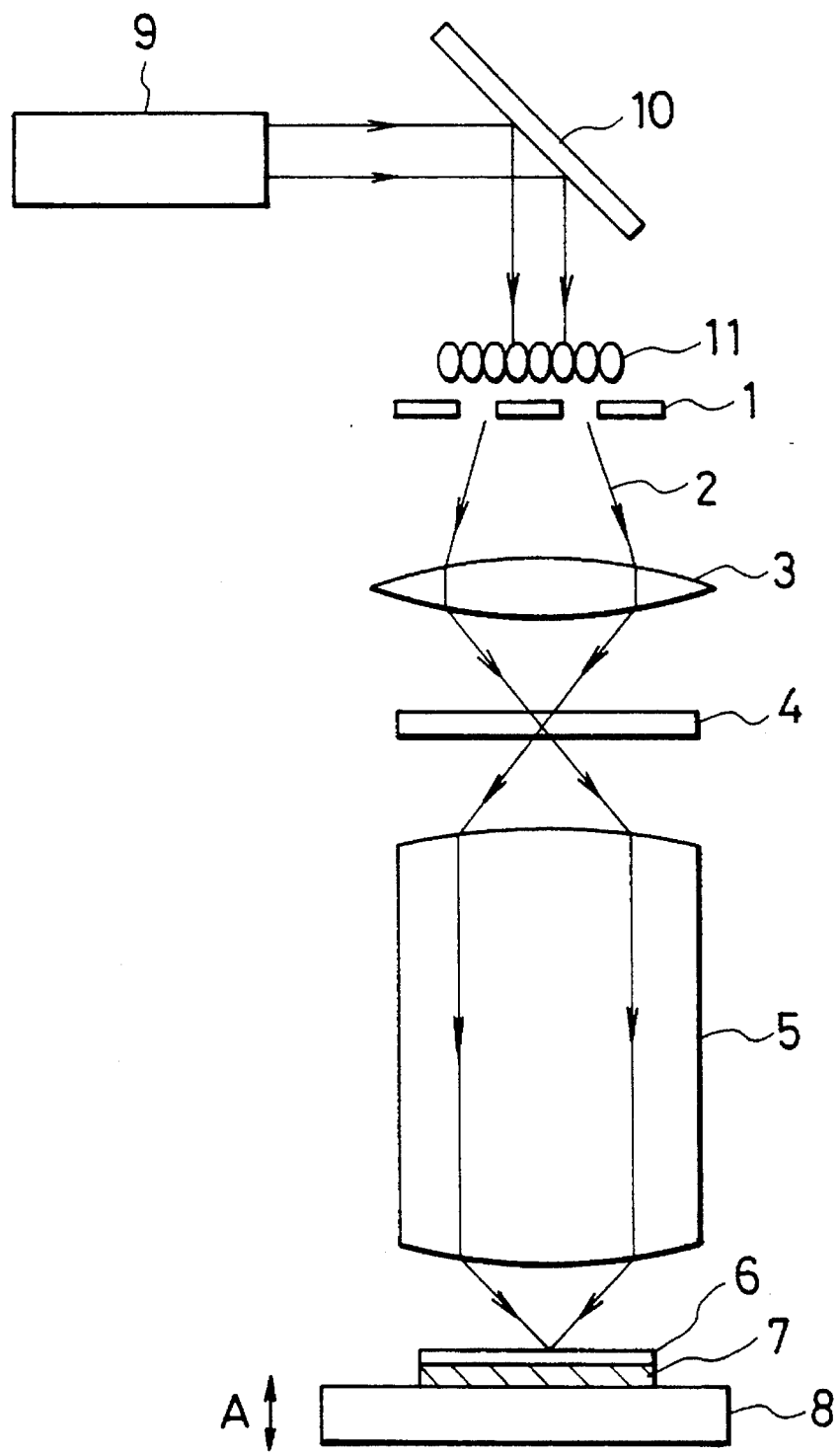
FIG. 3 schematically shows an embodiment of a project exposure system of the present invention.

FIG. 3 schematically shows a step-and-repeat projection exposure system or a stepper to be used for a projection exposure method of a first embodiment. As shown in FIG. 3, there is provided with a KrF excimer laser 9 whose central emission wavelength λ is 248 nm as a light source. A beam 2 of light emitted from the laser 9 is reflected by a reflection mirror 10 and enter a homogenizer 11 where the beam 2 is homogenized in intensity.

The beam 2 reflected by the mirror 10 has spatial fluctuation or variation in intensity, so that the homogenizer 11 is required. A fly-eye lens or the like may be used as the homogenizer 11.

Figure 5A:
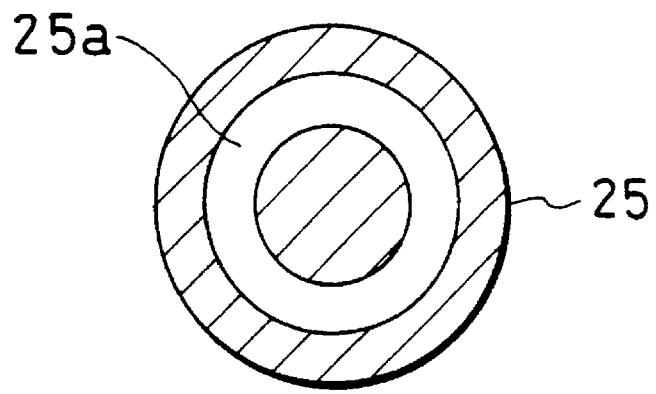
FIG. 5A is a plan view of an interruption plate used as an illumination darkening member.

The beam 2 of light thus homogenized reaches a beam modification member 1 for modifying the beam 2, which is disposed in the optical path of the beam 2. The member 1 may be formed of a circular interruption plate 25 shown in FIG. 5A or a circular interruption plate 26 shown in FIG. 5B.

The interruption plate 25 has a ring-shaped transparent part 25a disposed concentrically with the plate 25 itself. The beam 2 of light is interrupted in cross section at the circular central part and the ring-shaped fringe part of the plate 25. As a result, the central and fringe parts in the cross section of the beam 2 become darkened, which means that the beam 2 is modified.

The interruption plate 26 has four transparent parts 26a each of which is the same quarter circle in shape. The transparent parts 26a are disposed at equal intervals along a concentric circle with the plate 26 itself. In the case of the plate 26, the beam 2 of light is interrupted in cross section at the cross-shaped central part and the ring-shaped fringe part of the plate 26, resulting in the darkened central and fringe parts in the cross section of the beam 2.

Then, the beam 2 of light thus partially darkened passes through an illumination lens system 3 to illuminate an IC mask or reticle 4. The mask 4 has a given pattern to be transferred. The illumination lens system 3 may be formed of any lenses such as a condenser lens.

The beam 2 of light passed through the mask 4 is then reduced in size or demagnified, and projected to a photoresist film 6 formed on a semiconductor wafer 7 by a projection lens system 5. The photoresist film 6 is thus exposed to the beam 2 and an optical image is formed on the surface of the film 6. Thus, the pattern of the mask or reticle 4 is transferred to the film 6.

The projection lens system 5 may be formed of any lenses such as spherical or aspherical lenses.

The wafer 7 is placed on a wafer stage 8 which can move vertically along an arrow A. Therefore, the wafer 7 and photoresist film 6 can be moved upward or downward along the light axis of the projection lens system 5 during each exposure time of the photoresist film 6 and/or an interval of time between successive exposures thereof.

Figure 4A:
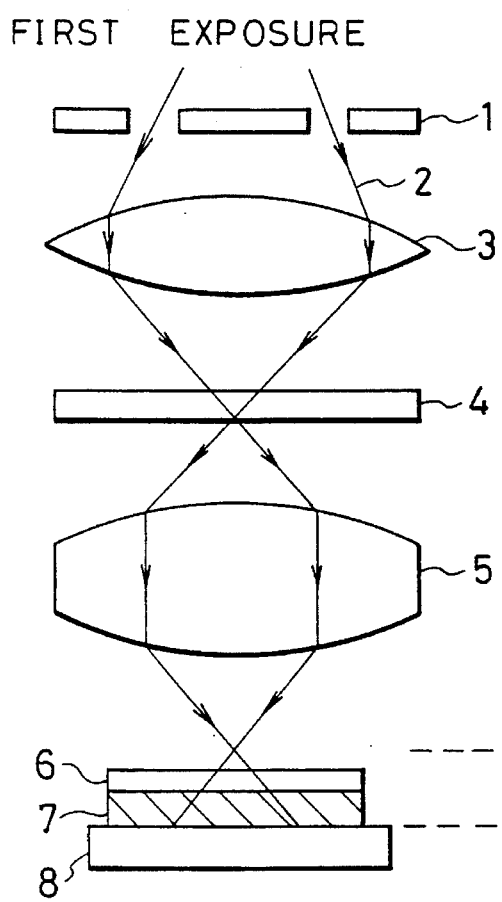
FIG. 4 schematically shows a first embodiment of a project exposure method of the present invention.
Figure 4B:
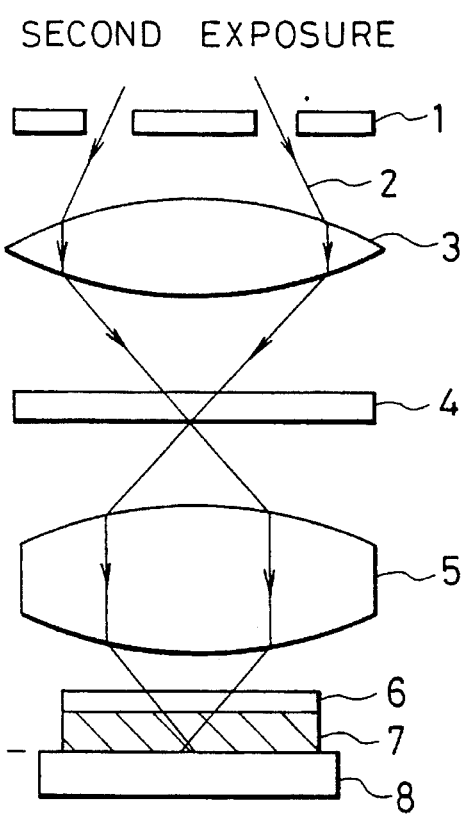

The projection exposure method of the first embodiment is carried out using the above-described projection exposure system as follows:

First, the wafer stage 8 is fixed at a given position where the surface of the photoresist film 6 is not in accordance with the focal plane of the optical projection system 5, and then, a first exposure is done. Here, as shown in FIG. 4, the focal point or the image formation plane of the projection lens system 5 is above the surface of the film 6.

During the first exposure, the beam 2 of light whose central and fringe parts are darkened illuminates to the mask or reticle 4 and is not projected in demagnification to the photoresist film 6. Since the surface of the film 6 is in accordance with the focal plane of the optical projection system 5, a first defocused optical image is formed on the surface of the photoresist film 6.

Next, the wafer stage 8 is moved upward together with the wafer 7 and the photoresist film 6 by a distance Δz along the optical axis of the projection lens system 5, and then fixed at another given position. The other components of the projection exposure system are not moved at this time. Subsequently, a second exposure is done.

During the second exposure, the beam 2 of light whose central and fringe parts are darkened illuminates to the mask 4 and is projected in demagnification to the photoresist film 6. Here, as shown in FIG. 4, the focal point or the image formation plane of the projection system 5 is below the surface of the film 6.

In this second exposure, similar to the first exposure, the surface of the film 6 is not in accordance with the focal plane of the optical projection system 5, so that a second defocused optical image is formed on the surface of the photoresist film 6.

After the second exposure is finished, the photoresist film 6 is developed. Thus, the pattern on the mask 4 is demagnified to be transferred to the photoresist film 6 by the first and second defocused optical images.

To confirm the effects of the present invention, tests were carried out according to the projection exposure method of the first embodiment.

Figure 5B:
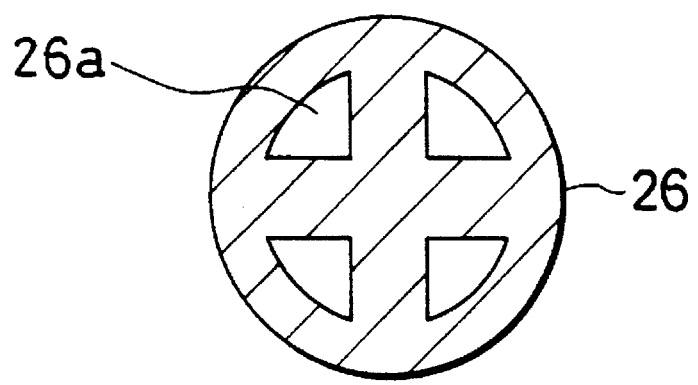
FIG. 5B is a plan view of another interruption plate used as an illumination darkening member.
Figure 6:
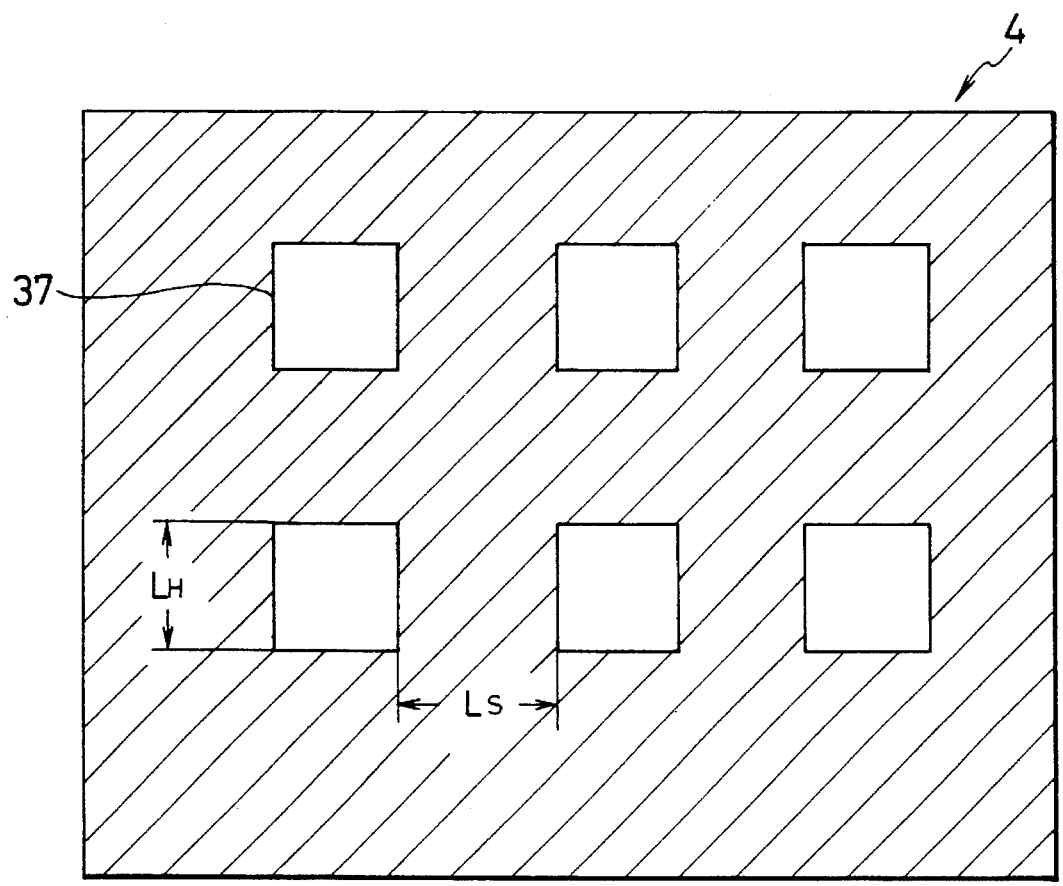
FIG. 6 is a plan view of an IC mask whose pattern is formed of closely arranged square shapes.

A mask pattern used in the tests is shown in FIG. 6 and the illumination modification member 1 used therein is the circular interruption plate 26 shown in FIG. 5B.

As shown in FIG. 6, the mask pattern is formed of six square shapes 37 which are arranged regularly at equal intervals. In FIG. 6, $L_H$ is a size or a side length of the square shape 37 and $L_S$ is a distance or pitch between the adjacent square shapes 37.

The other testing conditions are as follows:

The Numerical Aperture (NA) of the projection lens system 5 is 0.5 and the coherence factor σ of the stepper is 0.5. The size or side length $L_H$ of each square shape 37 was set so that a square contact hole to be formed on the wafer 7 by each square shape 37 was 0.25 μm in side length. The tolerance of the side length of the contact hole was set to be ±10% or less. The relative movement distance Δz was 1.2 μm. Each stripe of the cross-shaped central part of the interruption plate 26 was set in width to be 40% of the coherence factor σ.

Figure 7:
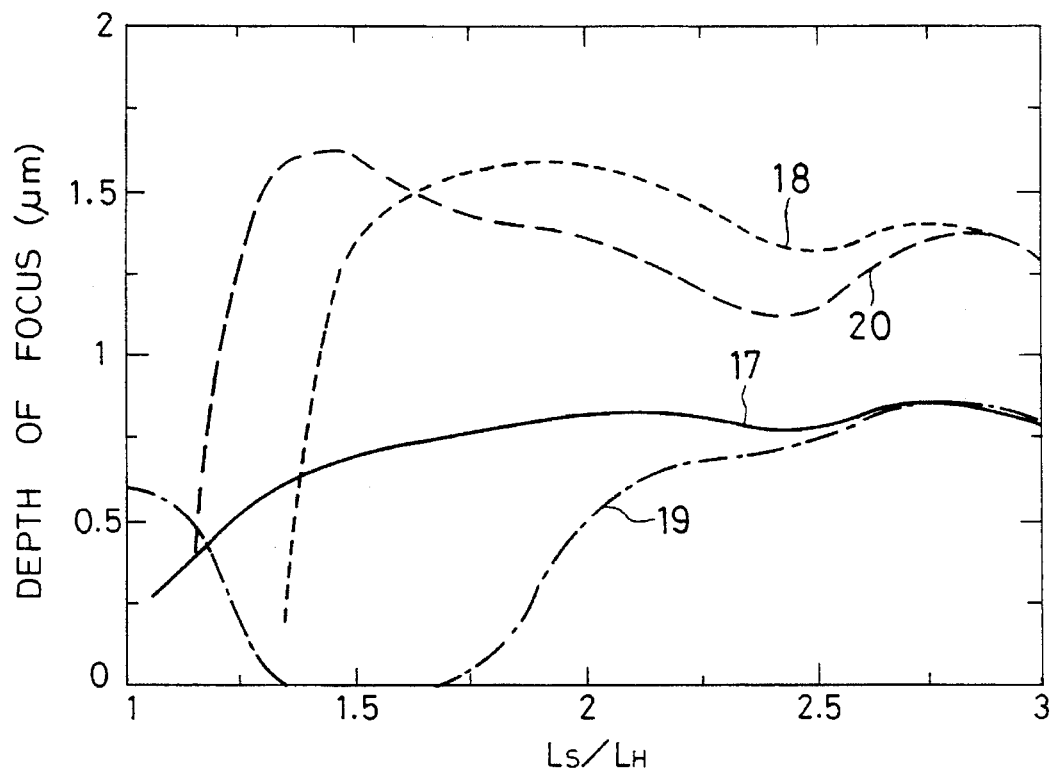
FIG. 7 is a graph showing relationships between a ratio $(L_S/L_H)$ and a depth of focus concerning the IC mask shown in FIG. 6, where $L_H$ is a size of the square shape and $L_S$ is a pitch of the adjacent square shapes.
Figure 8:
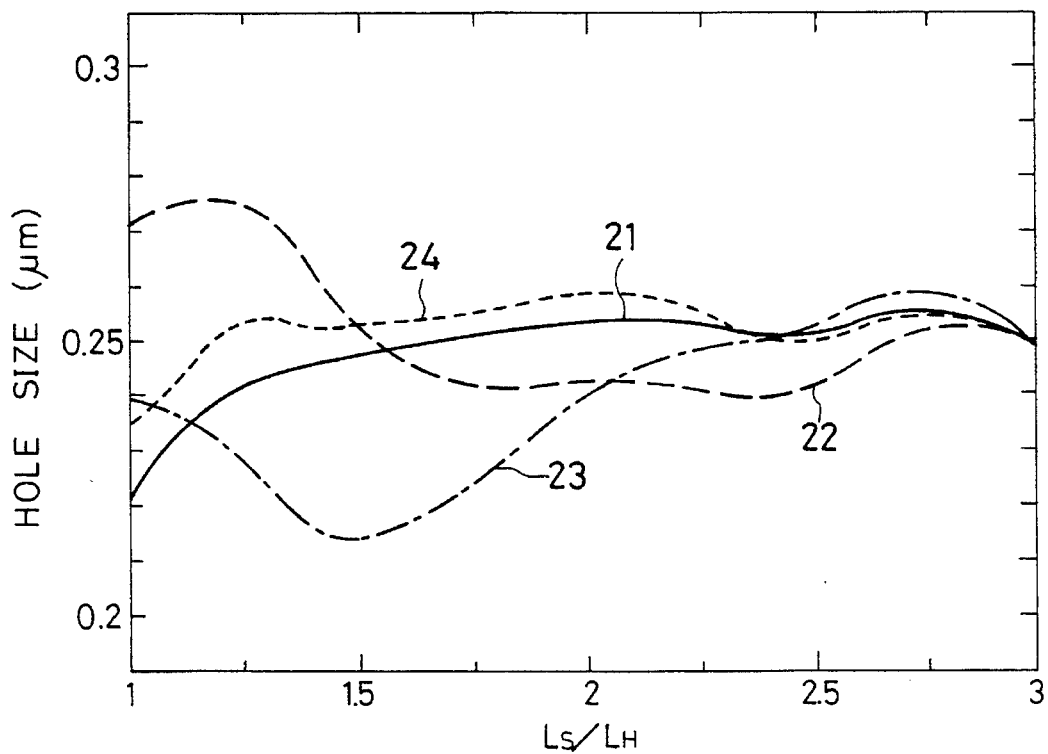
FIG. 8 is a graph showing relationships between a ratio $(L_S/L_H)$ and an obtainable hole size concerning the IC mask shown in FIG. 6.

FIG. 7 shows relationships between a ratio ($L_S/L_H$) and a depth of focus and FIG. 8 shows relationships between the ratio ($L_S/L_H$) and the hole size, both of which were obtained by the above-described tests. The hole size was measured on the focal plane of the projection lens system 5.

In FIG. 7, a curve 17 was obtained by a normal projection exposure method (normal method) using the same projection exposure system as the first embodiment, in which only one exposure was carried out and the surface of the photoresist film 6 was in accordance with the focal plane of the projection lens system 5.

A curve 18 was obtained by a projection exposure method (twice exposure method) based on the FLEX method using the same projection exposure system as the first embodiment, in which two exposures were carried out and two focal planes of the projection lens system 5 were created at different positions along the light axis of the projection lens system 5.

A curve 19 was obtained by the conventional projection exposure method using a modified illumination (modified illumination method), in which the same projection exposure system as the first embodiment was used. Only one exposure was carried out and the surface of the photoresist film 6 was not in accordance with the focal plane of the projection lens system 5 to obtain defocused optical image on the surface of the photoresist film 6.

In the case of the mask 4 shown in FIG. 6, in general, when the ratio ($L_S/L_H$) becomes large, each of the square shapes 37 can be considered substantially as an isolated square shape because it is scarcely affected by the diffraction waves of light generated from its adjacent square shapes 37. It is usually said that the effect by the diffraction waves may be ignored when the ratio ($L_S/L_H$) is 3 or more.

In the case of the twice exposure method, it is seen from FIG. 7 that the depth of focus (DOF) (curve 18) by the twice exposure method is larger than that (curve 17) by the normal method when the ratio ($L_S/L_H$) is about 3, in other words, each of the square shape 37 of the mask 4 can be considered as an isolated geometrical shape. It is also seen that the DOF (curve 18) by the twice exposure method becomes shallow suddenly due to contrast reduction when the ratio ($L_S/L_H$) is 1.5 or less.

Additionally, from FIG. 8, it is seen that the hole size (curve 22) by the twice exposure method becomes larger than the designed hole size of 0.25 μm when the ratio ($L_S/L_H$) is 1.5 or less.

In the case of the modified illumination method, it is seen from FIG. 7 that the DOF (curve 19) by the modified illumination method is larger than that (curve 17) by the normal method when the ratio ($L_S/L_H$) is 1.2 or less, and it is almost equal in value to that (curve 17) by the normal method when the ratio ($L_S/L_H$) is about 3.

Additionally, it is also seen from FIG. 7 that the DOF (curve 19) by the modified illumination method is zero (0) when the ratio ($L_S/L_H$) is in the vicinity of 1.5 in value. As shown in FIG. 8, the reason is that the hole size (curve 23) by the modified illumination method is which smaller than the designed hole size of 0.25 μm in the vicinity of 1.5.

With the projection exposure method of the first embodiment, it can be seen from FIG. 7 that the DOF (curve 20) obtained by the method of the first embodiment is 1 μm or more when the ratio ($L_S/L_H$) is in the range from 1.2 to 3. Additionally, it can be also seen from FIG. 8 that the hole size (curve 24) obtained by the method of the first embodiment is in the vicinity of the designed value of 0.25 μm, which means that the variation or fluctuation of the obtainable hole size is very small.

The reason that a deeper DOF is obtained in the first embodiment is as follows:

When the ratio ($L_S/L_H$) is in the vicinity of 1.5, as shown in FIG. 8, the hole size (curve 22) obtained by the twice exposure method becomes larger than the designed hole size of 0.25 μm and the hole size (curve 23) obtained by the modified illumination method becomes smaller than the designed one. Therefore, the effect of the twice exposure method which produces a larger hole size and that of the modified illumination method which produce a smaller hole size are cancelled or balanced with each other and as a result, the very small variation or fluctuation of the obtainable hole size can be obtained.

Figure 1:
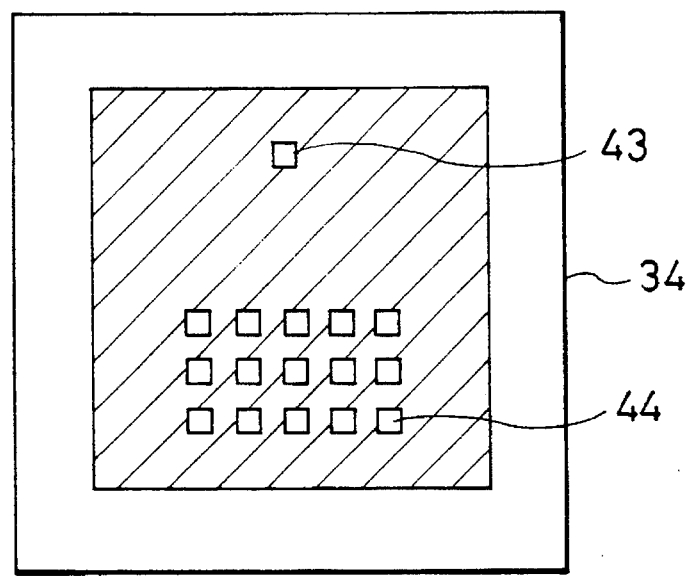
FIG. 1 is a plan view of an IC mask whose pattern is formed of an isolated square shape and closely arranged square shapes.
Figure 2:
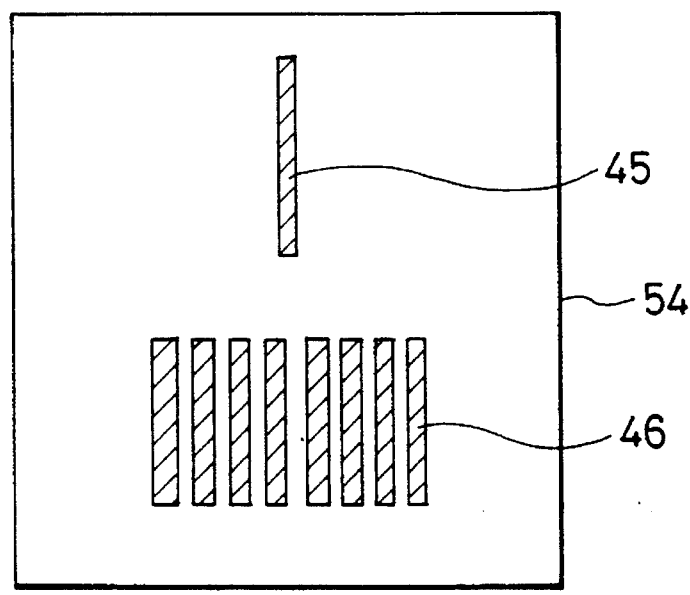
FIG. 2 is a plan view of another IC mask whose pattern is formed of an isolated linear shape and closely arranged linear shapes.

As described above, it can be confirmed that a mask pattern containing both an isolated geometrical shape and closely arranged geometrical shapes as shown in FIGS. 1 and 2 can be improved in DOF with the projection exposure method of the first embodiment.

For example, an obtainable depth of focus is 2.5 times as much as that of the normal method at the maximum and is 1.4 times at the minimum when the ratio ($L_S/L_H$) is in the range from 1.2 to 3 in value.

[Second Embodiment]

Figure 9:
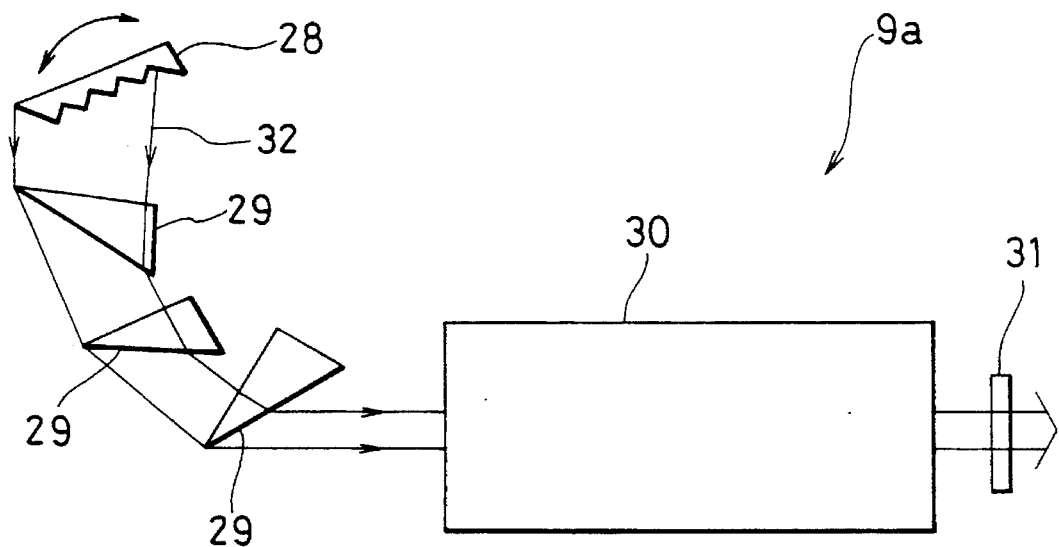
FIG. 9 schematically shows a second embodiment of a project exposure method of the present invention.

FIG. 9 schematically shows a KrF excimer laser 9a of a step-and-repeat projection exposure system, which is used for a projection exposure method of a second embodiment. This system has the same structure as that of the first embodiment shown in FIG. 3 except for the laser 9a.

As shown in FIG. 9, there is provided a diffraction grating 28, three prisms 29, a laser oscillator 30 and a half mirror 31. A beam 32 of light emitted from the laser oscillator 30 is reflected by the diffraction grating 28 and the half mirror 31 through the prisms 29, and it passes through the half mirror 31 to reach the reflection mirror 10. Then, the beam 32 of light illuminates to the mask 4 through the illumination modification member 1 and the illumination lens system 3, and the beam 32 thus partially darkened is projected to the photoresist film 6 through the projection lens system 5 in the same way as that of the first embodiment.

The diffraction grating 28 and the three prisms 29 serve as elements for narrowing the oscillation bandwidth of the beam 32. The diffraction grating 28 can be rocked around a given shaft (not shown) within a small angle, so that the central emission wavelength of the beam 32 can be changed continuously and accurately.

In the method of the first embodiment, the same beam 2 of light is used in the first and second exposures, in other words, the beam 2 does not change in wavelength between the exposures. However, in the method of the second embodiment, the beam 32 of light changes in its central emission wavelength between the first and second exposures.

First, in the same way as that of the first embodiment shown in FIG. 4, the wafer stage 8 is fixed at a given position where the surface of the photoresist film 6 is not in accordance with the focal plane of the projection lens system 5, and then, a first exposure is done. The beam 32 has a first central emission wavelength λ1 during the first exposure.

Next, unlike the first embodiment, a second exposure is done without vertical movement of the wafer stage 8, namely, the second exposure is carried out at the same position as in the first exposure. Instead, the beam 32 of light has a second central emission wavelength λ2 different from the first one λ1.

In general, a focal plane varies in position when a wavelength of a beam of light changes due to the chromatic aberration. Therefore, if the distance or variation between the focal planes is equal in value to the movement distance $\Delta z$ shown in FIG. 4, the focal plane variation becomes equivalent to the vertical movement of the stage 8, which means that the same effect as in the first embodiment can be obtained.

The movement distance $\Delta z$ and the emission wavelengths $\lambda 1$ and need to satisfy the following relationship (1).

$$\Delta z = (1+m)\frac{f}{n-1}\frac{dn}{d\lambda}\Delta\lambda \qquad (1)$$

where m is the demagnification of the projection lens system 5, f is the focal length thereof, n is the refractive index of the material of the projection lens system 5, $(dn/d\lambda)$ is the dispersion of the refractive index n, and $\Delta\lambda$ is the difference of the central emission wavelengths $\lambda 1$ and $\lambda 2$.

For example, when $m=(\frac{1}{5})$, $f=100$ mm, $n=1.51$ (at a wavelength 248.3 nm of synthetic quartz), $(dn/d\lambda)=0.24$ $\mu m^{-1}$ (at a wavelength 248.3 nm of synthetic quartz) and $\Delta\lambda=21$ pm, the relative movement distance $\Delta z$ is 1.2 µm.

With a KrF excimer laser, in general, the central emission wavelength is 248.3 nm and the half width of the wavelength spectrum is 350 pm. However, to restrict the chromatic aberration, the KrF excimer laser 9a used in the second embodiment is narrowed in half width of the wavelength spectrum to be 3 pm by using the diffraction grating 28, the prisms 29 and the oscillator 30 as a Fabry-Perot Etalon. The laser 9a can produce a beam of light whose central wavelengths are 248.2 nm and 248.31 nm by rocking the diffraction grating 28.

Therefore, in the second embodiment, the central emission wavelengths $\lambda 1$ and $\lambda 2$ may be 248.2 nm and 248.31 nm, respectively.

[Third Embodiment]

Figure 10:
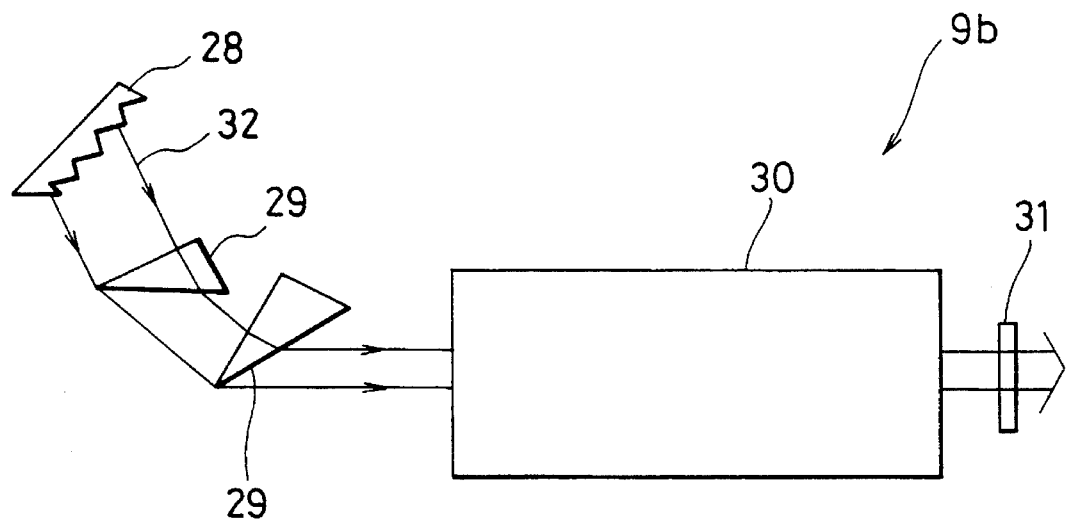
FIG. 10 schematically shows a third embodiment of a project exposure method of the present invention.

FIG. 10 schematically shows a KrF excimer laser 9b of a step-and-repeat projection exposure system, which is used for a projection exposure method of a third embodiment. This projection exposure system has the same structure as that of the first embodiment shown in FIG. 3 except for the laser 9b.

The KrF excimer laser 9b shown in FIG. 10 has the same configuration as the KrF excimer laser 9a shown in FIG. 9 except that only two prisms 29 are provided. Therefore, the narrowing action in half width of the wavelength spectrum is smaller than that of the second embodiment, resulting in a wider half width of the wavelength spectrum than that in the second embodiment. For example, the half width may be 20 pm.

In the third embodiment, only one exposure step is carried out and the beam 32 is continuously changed in central emission wavelength by rocking the diffraction grating 28 during the exposure. In this embodiment, the photoresist film 6 is exposed to the beam 32 of light containing a plurality of central emission wavelengths which change continuously in value.

Also in the third embodiment, the same effect as that of the first embodiment can be obtained.

[Fourth Embodiment]

Figure 11A:
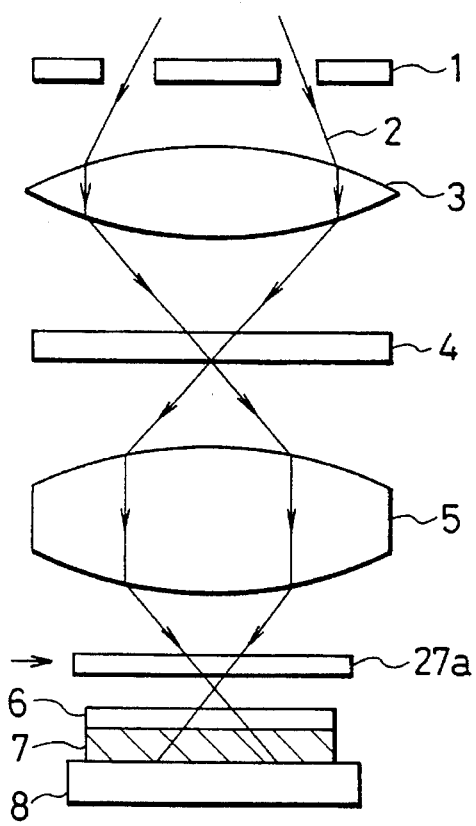
FIG. 11 schematically shows a fourth embodiment of a project exposure method of the present invention.
Figure 11B:
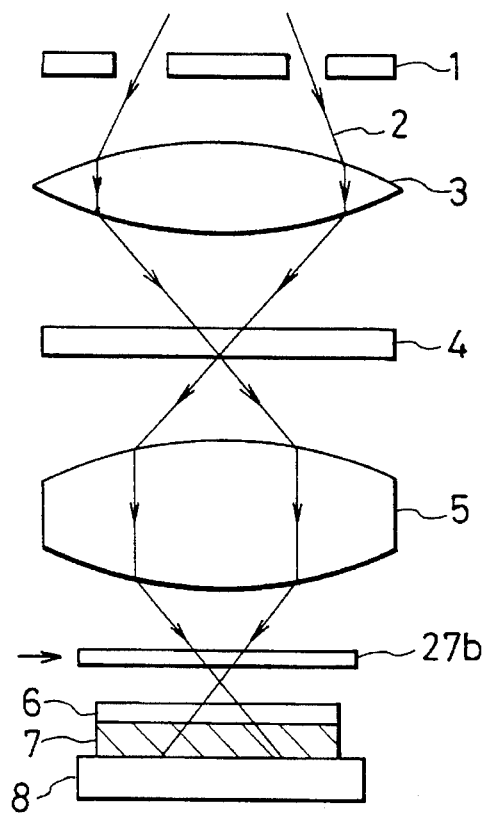

FIG. 11 schematically shows a projection exposure method of a fourth embodiment, which is carried out using the projection exposure system of the first embodiment shown in FIG. 3.

First, the wafer stage 8 is fixed at a given position where the surface of the photoresist film 6 is not in accordance with the focal plane of the projection lens system 5, and then, a first exposure is done. During the first exposure, there is provided with a first transparent plate 27a having a first refractive index n1 between the projection lens system 5 and the photoresist film 6. The beam 2 of light whose central and fringe parts are darkened passes through the projection lens system 5 and the first transparent plate 27a to be projected to the photoresist film 6.

Similar to the first embodiment, the focal point or the image formation plane of the projection lens system 5 is above the surface of the film 6, so that a defocused optical image is formed on the surface of the photoresist film 6.

The transparent plate 27a is replaced by a second transparent plate 27b having a second refractive index n2 where n2≠n1. Then, a second exposure is carried out without both vertical movement of the wafer stage 8 and wavelength change of the beam 2 of light, resulting in a second exposure of the photoresist film 6 to the beam 2 of light.

The difference in optical path of the first and second transparent plates 27a and 27b results in the difference in focal length of the projection lens system 5, which is equivalent to the difference in position of the stage 8. Therefore, no vertical movement of the wafer stage 8 and no wavelength change of the beam 2 of light are required.

The first and second transparent plates 27a and 27b may be made of any materials such as synthetic quartz through which the beam 2 of light in the ultraviolet region of the spectrum can pass.

If the difference between the optical path lengths in the first and second exposures is equal in value to the movement distance $\Delta z$ of the wafer stage 8, the fourth embodiment becomes equivalent to the first embodiment entirely. Here, the first and second transparent plates 27a and 27b are both made of synthetic quartz, so that the plates 27a and 27b are required to have a thickness difference $\Delta t$ therebetween in order to produce an optical path length difference equal in value to the movement distance $\Delta z$.

The thickness difference $\Delta t$ should satisfy the following relationship (2).

$$\Delta t = \frac{\Delta z}{n_f - 1} \qquad (2)$$

where $n_f$ is a refractive index of the material of the plates 27a and 27b, or synthetic quartz.

For example, when the movement distance $\Delta z$ or the focal length difference is 1.2 µm, the thickness difference $\Delta t$ of the plates 27a and 27b needs to be 2.4 µm.

Also in the fourth embodiment, the same effect as that of the first embodiment can be obtained.

[Fifth Embodiment]

Figure 12A:
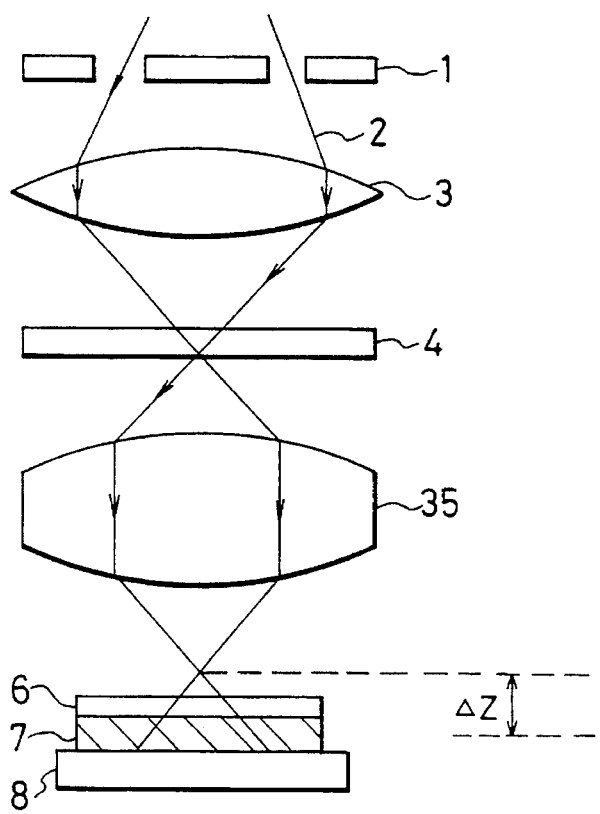
FIG. 12 schematically shows a fifth embodiment of a project exposure method of the present invention.
Figure 12B:
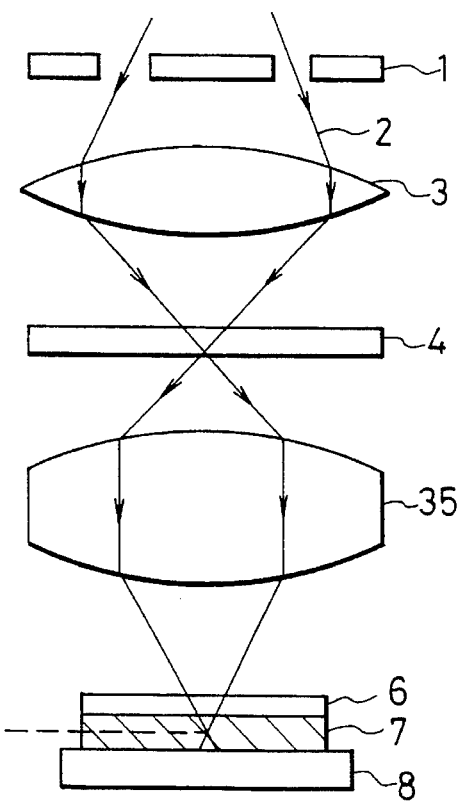

FIG. 12 schematically shows a projection exposure method of a fifth embodiment, which is also carried out using the projection exposure system of the first embodiment shown in FIG. 3.

There is provided projection lens system 35 acting as a bifocal lens instead of the projection lens system 5 shown in FIG. 4. The bifocal lens 35 has first and second focal points which can be switched to be used by shifting the position of the system 35.

The distance between the first and second focal points or planes is set to be equal in value to the movement distance $\Delta z$ of the wafer stage 8.

A first exposure is carried out in the same way as that of the first embodiment using the first focal point of the projection lens system 35. Then, a second exposure is carried out without vertical movement of the wafer stage 8 and wavelength change of the beam 2 of light after the first focal point of the system 35 is switched to the second one thereof.

In the fifth embodiment, the distance between the first and second focal points is equal in value to the movement distance Δz of the wafer stage 8, so that the same effect as the first embodiment can be obtained.

In the first to fifth embodiments above-described, a KrF excimer laser is used as a light source, however, any other lasers such as ArF excimer laser may be used. Also, the i line of a High-Pressure Mercury Vapor lamp or the like may be used instead of the lasers. Further, an oscillating mirror or an oscillating prism may be used as the darkening member instead of the interruption plates 25 and 26 shown in FIGS. 5A and 5B.

What is claimed is:

1. A projection exposure method comprising the steps of:

producing a beam of light whose central part in cross section is darkened, said beam of light being able to vary in wavelength;

illuminating said darkened beam of light to a mask having a pattern through an optical illumination system;

projecting said darkened beam of light to a photoresist film formed on a substrate through said mask and an optical projection system to carry out a first exposure, said darkened beam having a first wavelength; and projecting said darkened beam of light to said photoresist film through said mask and said optical projection system to carry out a second exposure, said darkened beam having a second wavelength which is different from said first wavelength, wherein the positions of said optical projection system and said photoresist film are identical to those in said first exposure;

wherein a surface of said photoresist film is not in accordance with a focal plane of said optical projection system in said first and second exposures and said pattern of said mask is transferred on said photoresist film through said first and second exposures.

2. A projection exposure method as claimed in claim 1 wherein said optical projection system comprises a spherical lens.

3. A projection exposure method as claimed in claim 1 wherein said optical projection system comprises an aspherical lens.

4. A projection exposure method comprising the steps of:

producing a beam of light whose central part in cross section is darkened, said beam of light being able to vary in wavelength;

illuminating said darkened beam of light to a mask having a pattern through an optical illumination system; and projecting said darkened beam of light to a photoresist film formed on a substrate through said mask and an optical projection system to carry out an exposure, said darkened beam of light varying continuously in wavelength during said exposure;

wherein a surface of said photoresist film is not in accordance with a focal plane of said optical projection system in said exposure, and said pattern of said mask is transferred on said photoresist film through said exposure.

5. A projection exposure method comprising the steps of:

producing a beam of light whose central part in cross section is darkened;

illuminating said darkened beam of light to a mask having a pattern through an optical illumination system;

projecting said darkened beam of light to a photoresist film formed on a substrate through said mask and an optical projection system to carry out a first exposure, an optical path of said darkened beam of light between said mask and said photoresist film having a first length; and projecting said darkened beam of light to said photoresist film through said mask and said optical projection system to carry out a second exposure, said optical path of said darkened beam of light having a second length which is different from said first length;

wherein a surface of said photoresist film is not in accordance with a focal plane of said optical projection system in said first and second exposures, respectively, and said pattern of said mask is transferred on said photoresist film through said first and second exposures.

6. A projection exposure method as claimed in claim 5, wherein a transparent member is provided between said mask and said photoresist film in one of said first and second exposures to produce said difference in said optical path of said darkened beam of light.

7. A projection exposure method as claimed in claim 5, wherein a first transparent member is provided between said mask and said photoresist film in said first exposure and a second transparent member is provided therebetween in said second exposure to produce said difference in said optical path of said darkened beam of light.

8. A projection exposure method comprising the steps of:

producing a beam of light whose central part in cross section is darkened;

illuminating said beam of light to a mask having a pattern through an optical illumination system;

projecting said darkened beam of light to a photoresist film formed on a substrate through said mask and an optical projection system to carry out a first exposure, said optical projection system having a plurality of different focal points and said darkened beam of light being projected using a first one of said plurality of focal points; and projecting said darkened beam of light to said photoresist film through said mask and said optical projection system to carry out a second exposure, said darkened beam of light being projected using a second one of said plurality of focal points;

wherein a surface of said photoresist film is not in accordance with a focal plane of said optical projection system in said first and second exposures, respectively, and said pattern of said mask is transferred on said photoresist film through said first and second exposures.

9. A projection exposure method as claimed in claim 8 wherein said optical projection system comprises a bifocal lens.

* * * * *

UNITED STATES PATENT AND TRADEMARK OFFICE
CERTIFICATE OF CORRECTION

PATENT NO. : 5,476,736
DATED : December 19, 1995
INVENTOR(S) : Hiroyoshi Tanabe

It is certified that error appears in the above-indentified patent and that said Letters Patent is hereby corrected as shown below:

Col. 6, line 13, delete "not".

Col. 6, line 14, after "is", insert --not--.

Col. 7, line 53, delete "which", insert --much--.

Col. 9, line 8, after "and", insert --$\lambda 2$--.

Col. 10, line 6, delete "nl", insert --n1--.

Col. 10, line 45, delete "$n_j$", insert --$n_f$--.

Col. 10, line 47, delete "$n_j$", insert --$n_f$--.

Signed and Sealed this

Twenty-first Day of May, 1996

*Attest:*

BRUCE LEHMAN

*Attesting Officer*  *Commissioner of Patents and Trademarks*